(12) United States Patent
Shafai et al.

(10) Patent No.: US 8,443,256 B2
(45) Date of Patent: May 14, 2013

(54) METHOD AND APPARATUS FOR DETERMINING A CYCLIC REDUNDANCY CHECK (CRC) FOR A DATA MESSAGE

(75) Inventors: Farhad Shafai, Kanata (CA); Kelvin Spencer, Kanata (CA); Jason Coppens, Ottawa (CA)

(73) Assignee: Xilinx, Inc., San Jose, CA (US)

( * ) Notice: Subject to any disclaimer, the term of this patent is extended or adjusted under 35 U.S.C. 154(b) by 262 days.

(21) Appl. No.: 13/012,588

(22) Filed: Jan. 24, 2011

(65) Prior Publication Data

US 2012/0192044 A1   Jul. 26, 2012

(51) Int. Cl.
*H03M 13/00* (2006.01)

(52) U.S. Cl.
USPC .................. 714/758; 714/801; 714/781

(58) Field of Classification Search .......... 714/758, 714/781, 807
See application file for complete search history.

(56) References Cited

U.S. PATENT DOCUMENTS

| | | | |
|---|---|---|---|
| 5,467,359 A * | 11/1995 | Huon et al. .......... 714/755 |
| 6,038,694 A * | 3/2000 | Swallow .............. 714/781 |
| 6,189,124 B1 | 2/2001 | Glaise |
| 6,519,737 B1 | 2/2003 | Derby |
| 6,519,738 B1 | 2/2003 | Derby |
| 6,530,057 B1 | 3/2003 | Kimmitt |
| 6,609,225 B1 | 8/2003 | Ng |
| 6,701,479 B2 | 3/2004 | Keller |
| 6,766,493 B1 | 7/2004 | Hoffman et al. |
| 6,938,197 B2 | 8/2005 | Doubler et al. |
| 6,961,893 B1 * | 11/2005 | Mukund et al. ........ 714/781 |
| 7,036,067 B2 * | 4/2006 | Roy et al. ............ 714/758 |
| 7,191,383 B2 | 3/2007 | Lin et al. |
| 7,225,387 B2 | 5/2007 | Lin et al. |
| 7,290,196 B1 | 10/2007 | Annayya et al. |
| 7,577,895 B2 * | 8/2009 | Venkataramana et al. ... 714/758 |
| 7,647,472 B2 * | 1/2010 | Brightman et al. ........ 712/10 |
| 8,166,369 B2 * | 4/2012 | Chuang et al. ........... 714/769 |

OTHER PUBLICATIONS

"Cyclic Codes for Error Detection", W.W. Peterson et al., Proceedings of the IRE, Aug. 1, 1960, University of Florida and IBM Corp., pp. 228-235.
"Parallel CRC Realization", Giuseppe Campobello et al., pp. 1-20.
"A Systemic Approach for Parallel CRC Computations", Ming-Der Shieh, et al., Journal of Information Science and Engineering 17, Jul. 26, 1999, pp. 445-461.

* cited by examiner

*Primary Examiner* — Esaw Abraham
(74) *Attorney, Agent, or Firm* — Marks & Clerk Canada; Lois D. Cartier

(57) ABSTRACT

A method of creatine a CRC (Cyclic Redundancy Check) code for a data message in a data communications system includes sequentially placing portions of the data message on a bus of width W bits consisting of an integral number N of segments of width S. An initial portion of the message fills n complete segments, where n<N. The method further includes processing the initial portion of the message placed on the bus to compute a CRC while compensating for any data on the bus preceding the initial portion, and subsequently processing one or more following portions of the message placed on the bus to update the CRC. A final portion of the message is processed to update the CRC by separately processing complete segments that do not fill the bus and any bytes that do not completely fill the last segment.

37 Claims, 9 Drawing Sheets

Full Processing Circuit to Calculate CRC on 512 Bit Input Data

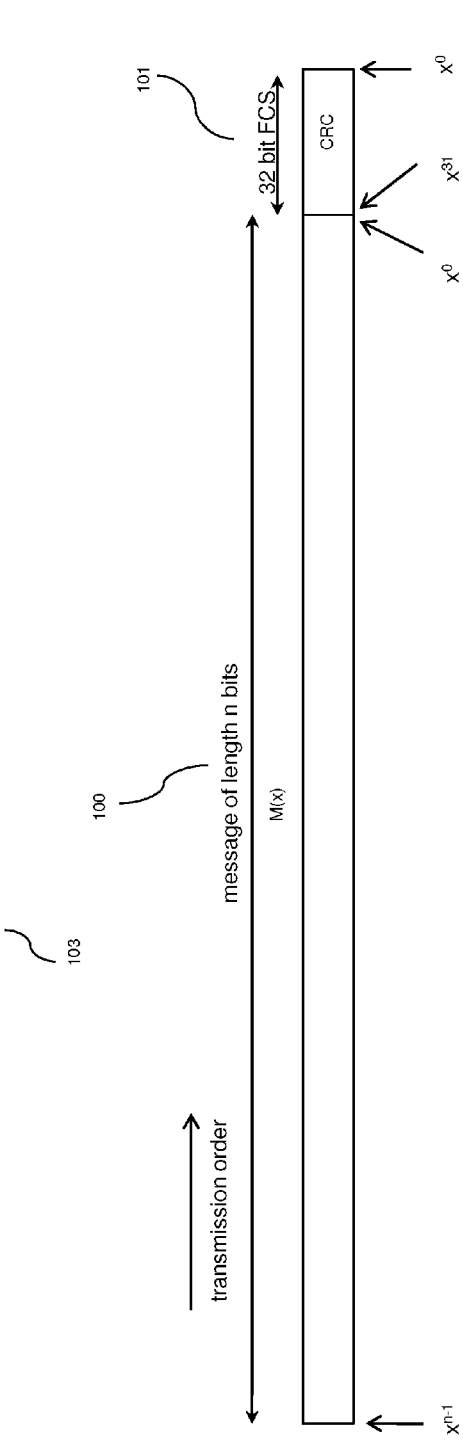
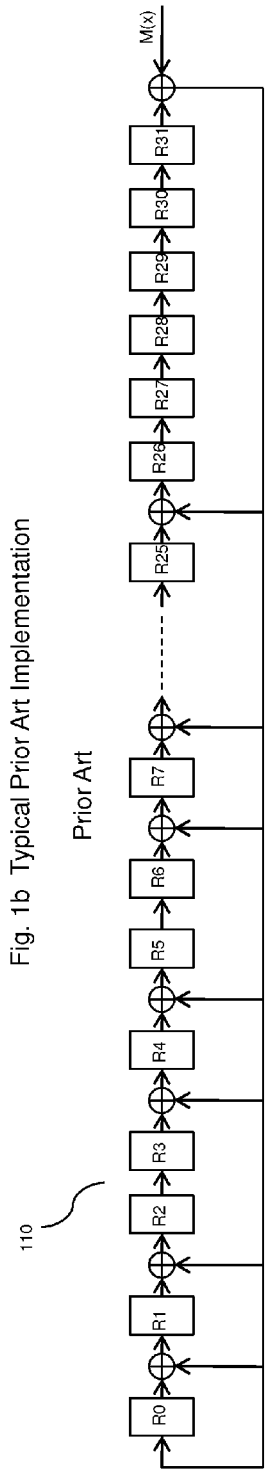
Fig. 1a Typical CRC Definition
$G(x) = x^{32} + x^{26} + x^{23} + x^{22} + x^{16} + x^{12} + x^{11} + x^{10} + x^8 + x^7 + x^5 + x^4 + x^2 + x + 1$
Fig. 1b Typical Prior Art Implementation

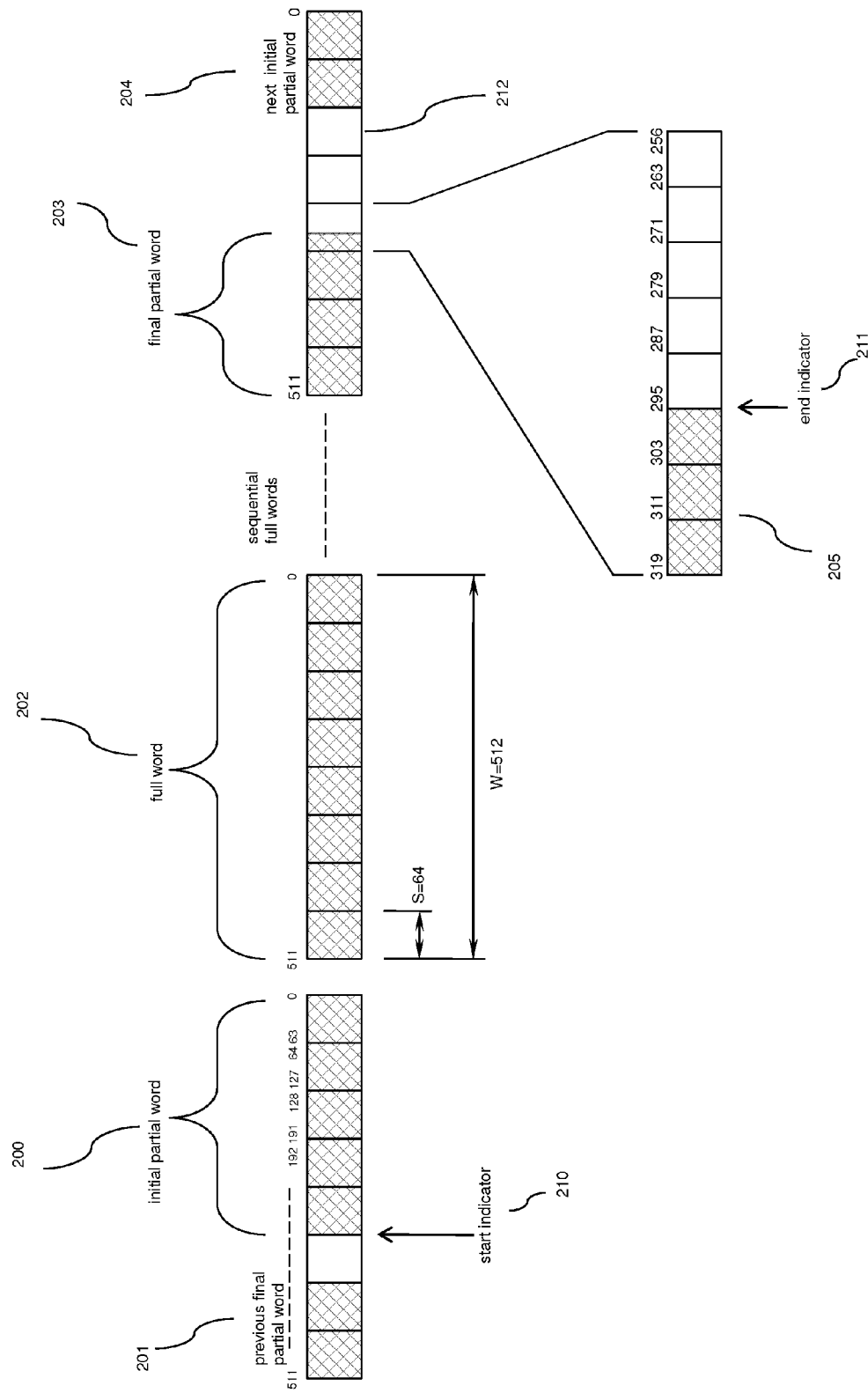

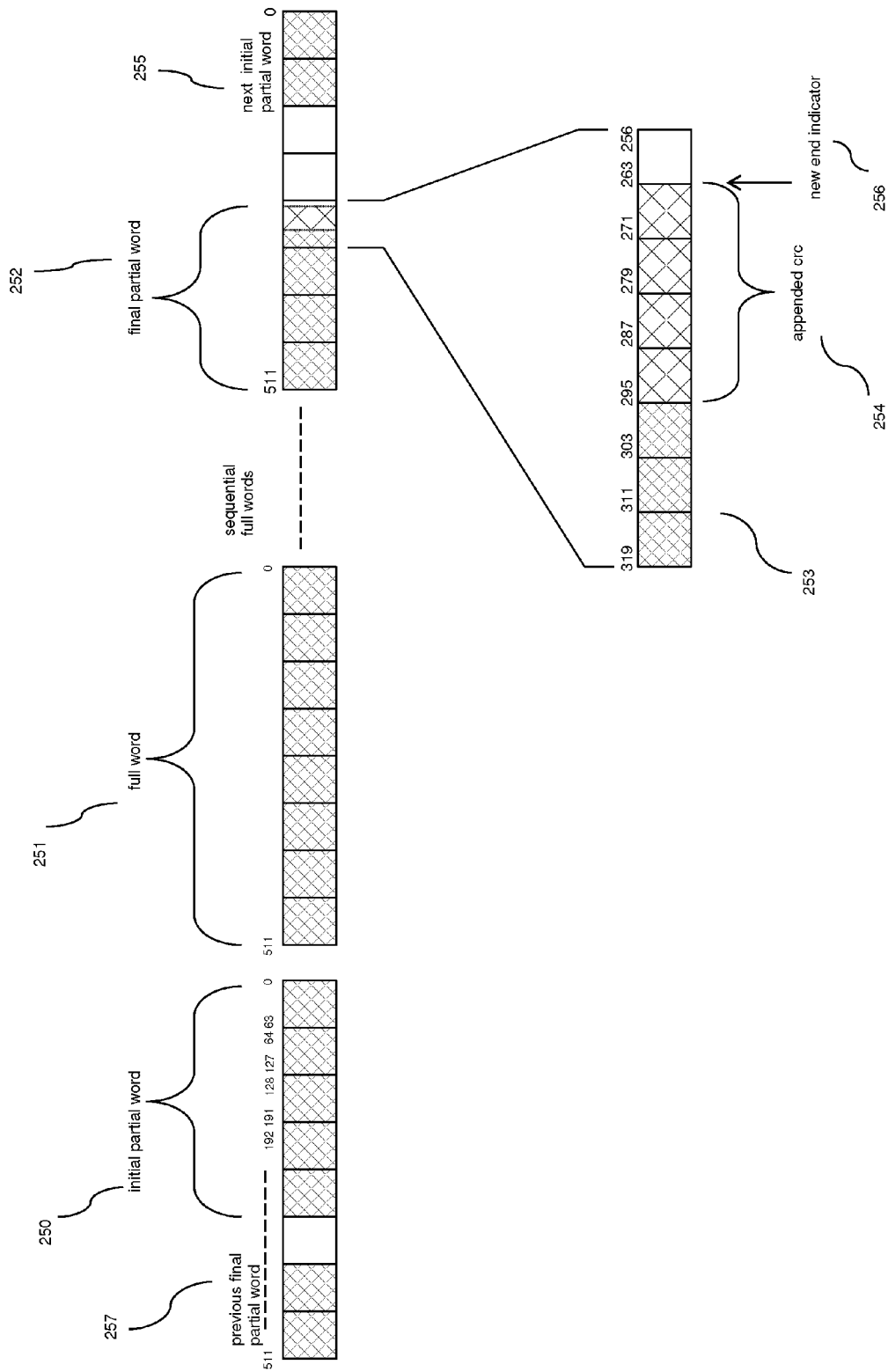
Fig. 2b Example Output Bus Occupancy

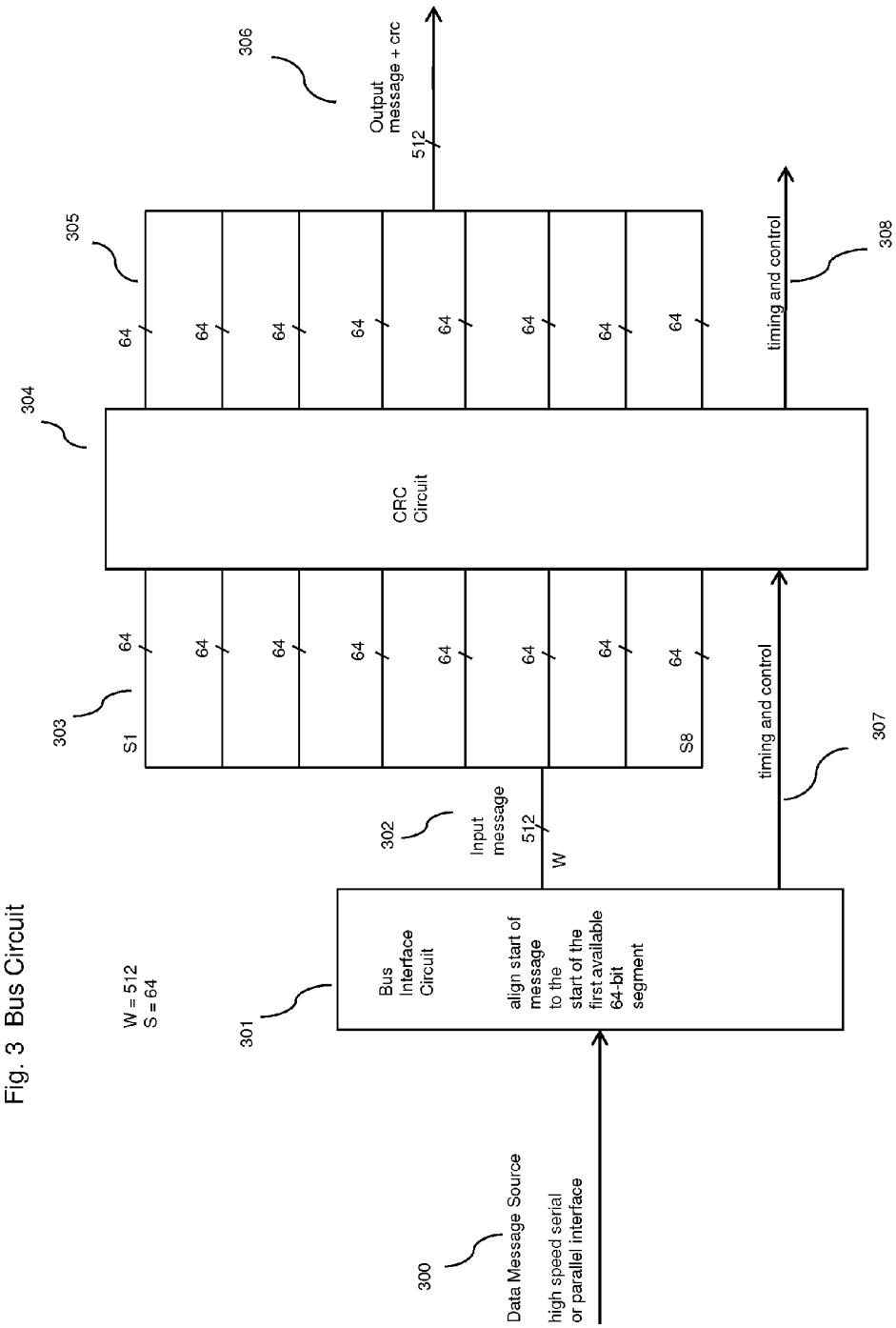

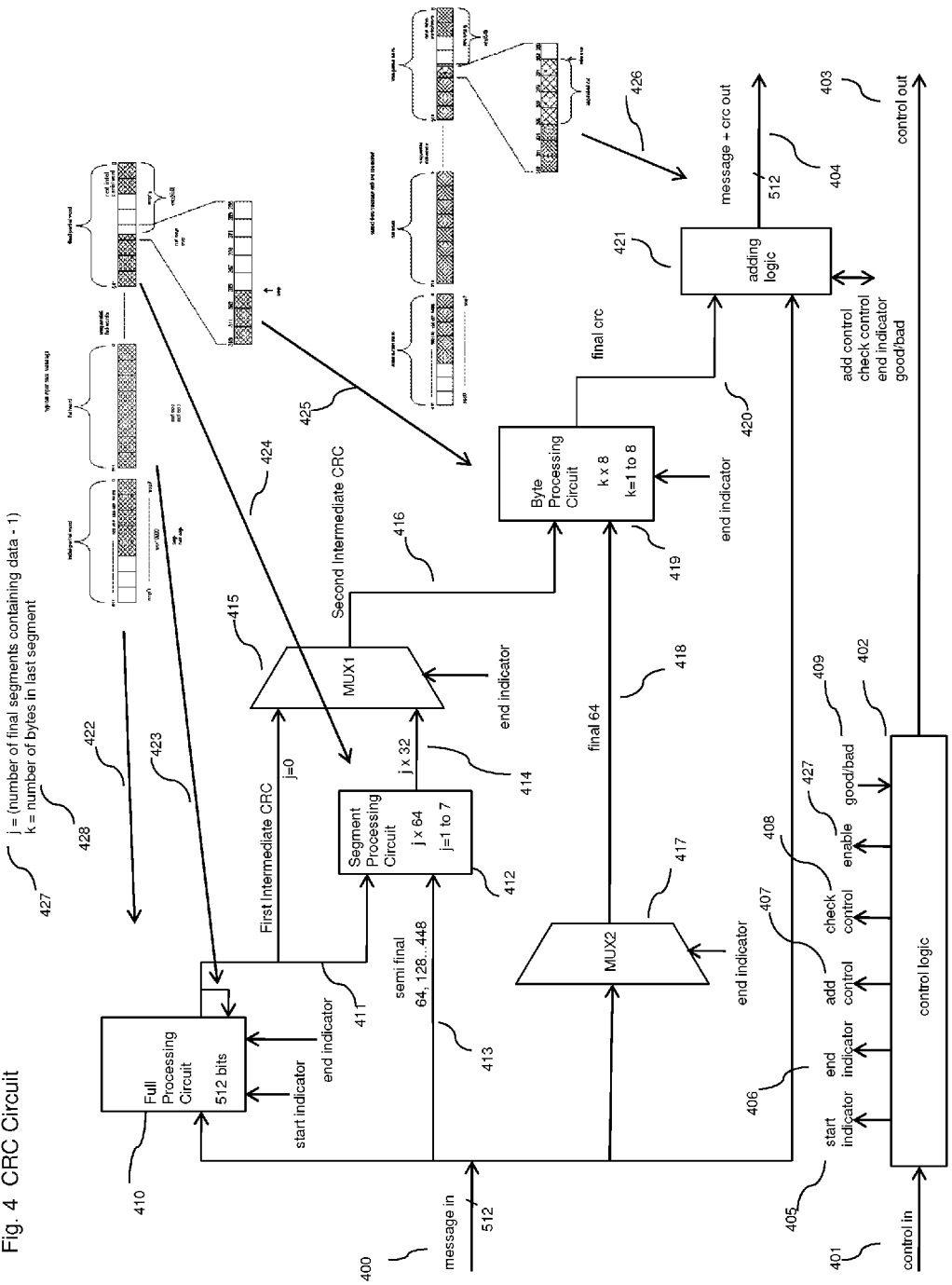
Fig. 4 CRC Circuit

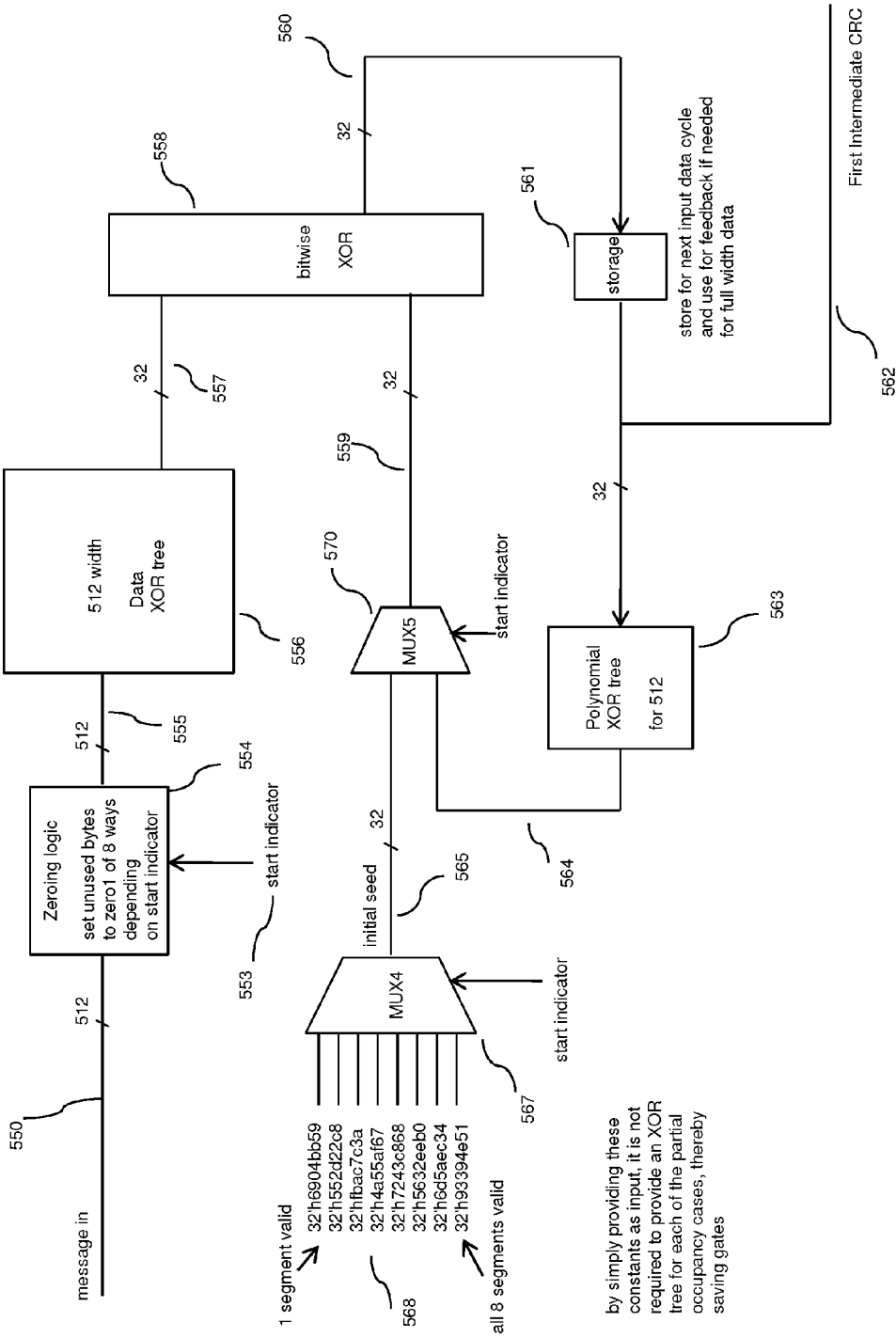
Fig. 5 Full Processing Circuit to Calculate CRC on 512 Bit Input Data

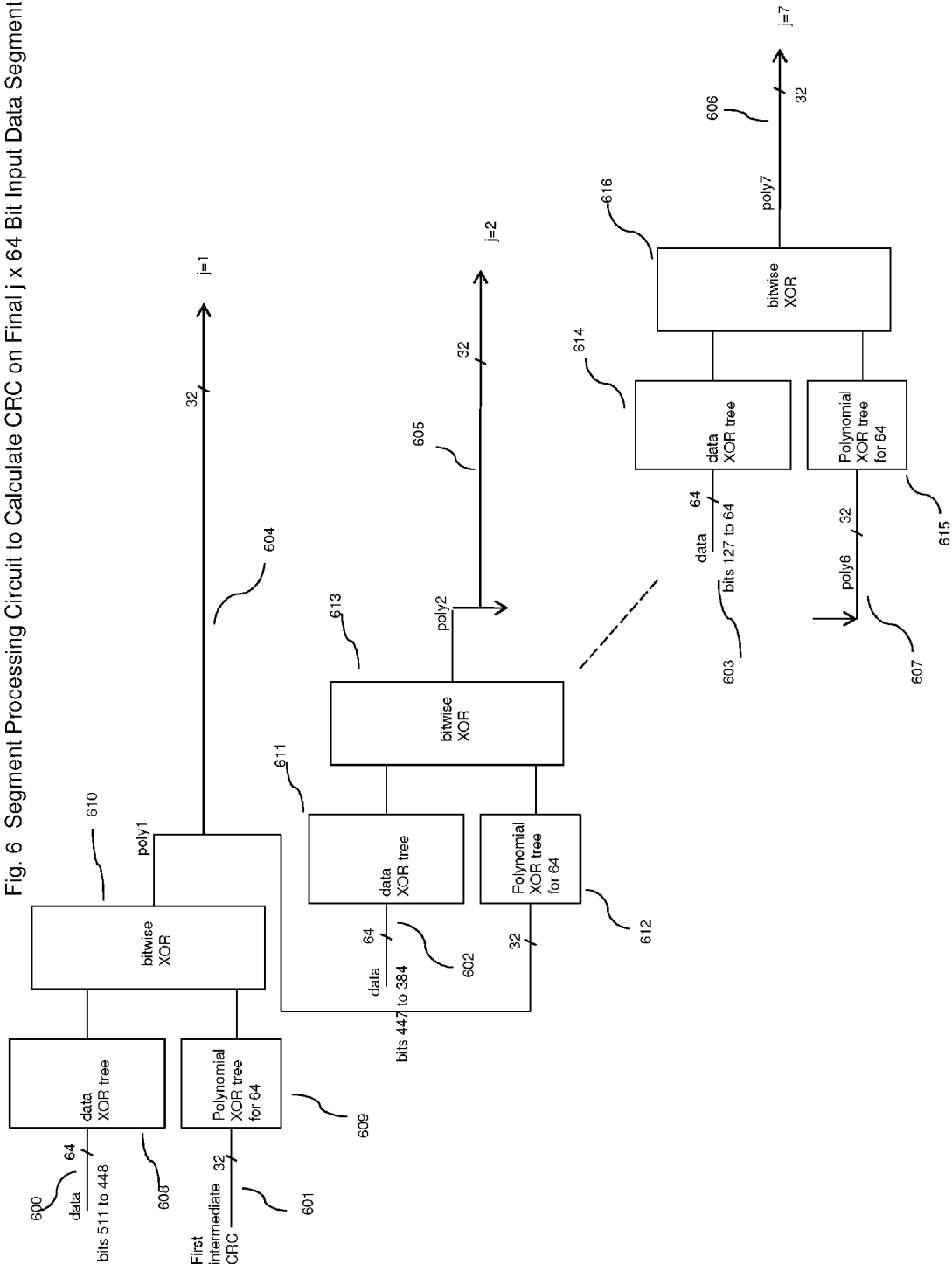
Fig. 6 Segment Processing Circuit to Calculate CRC on Final j x 64 Bit Input Data Segments

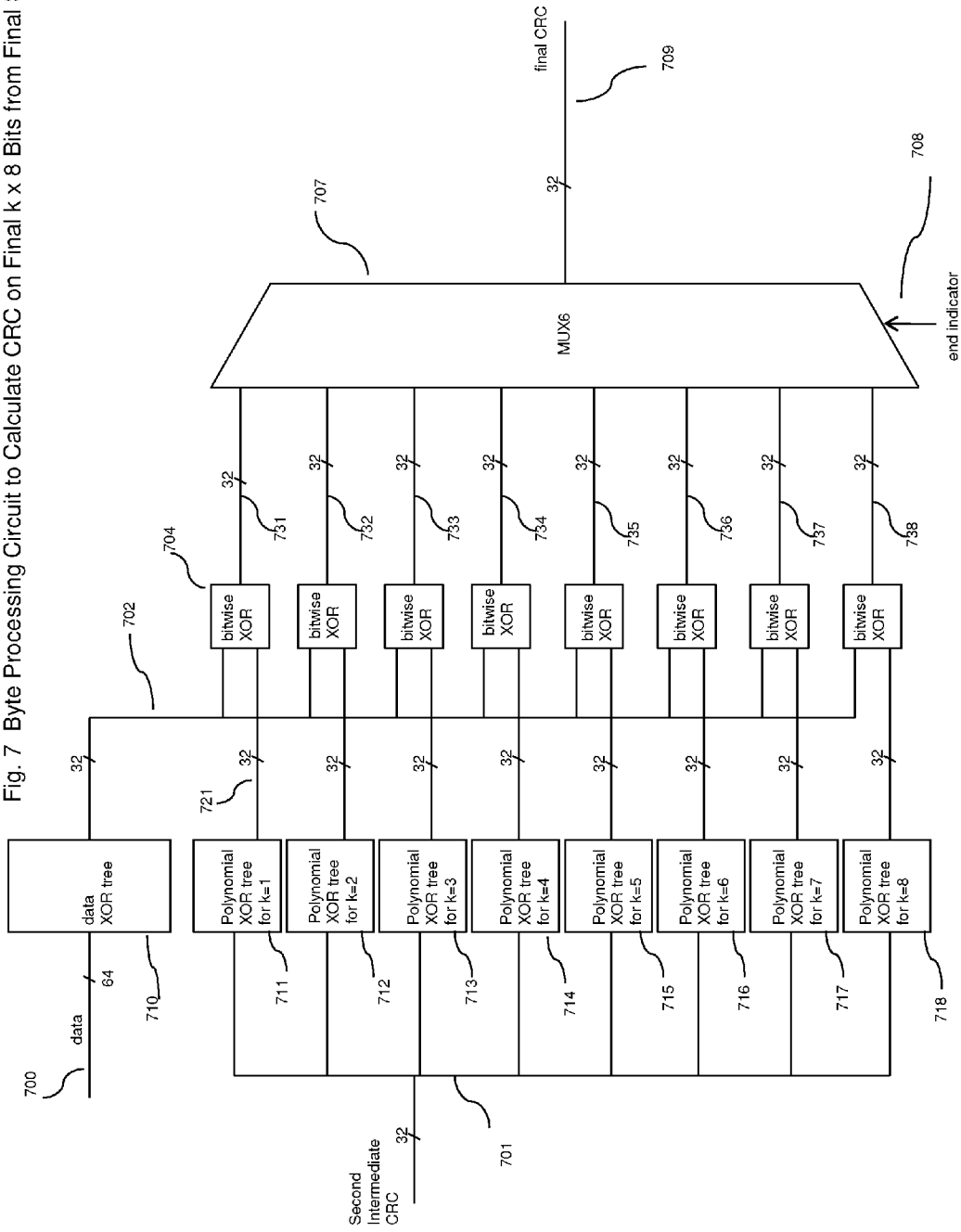

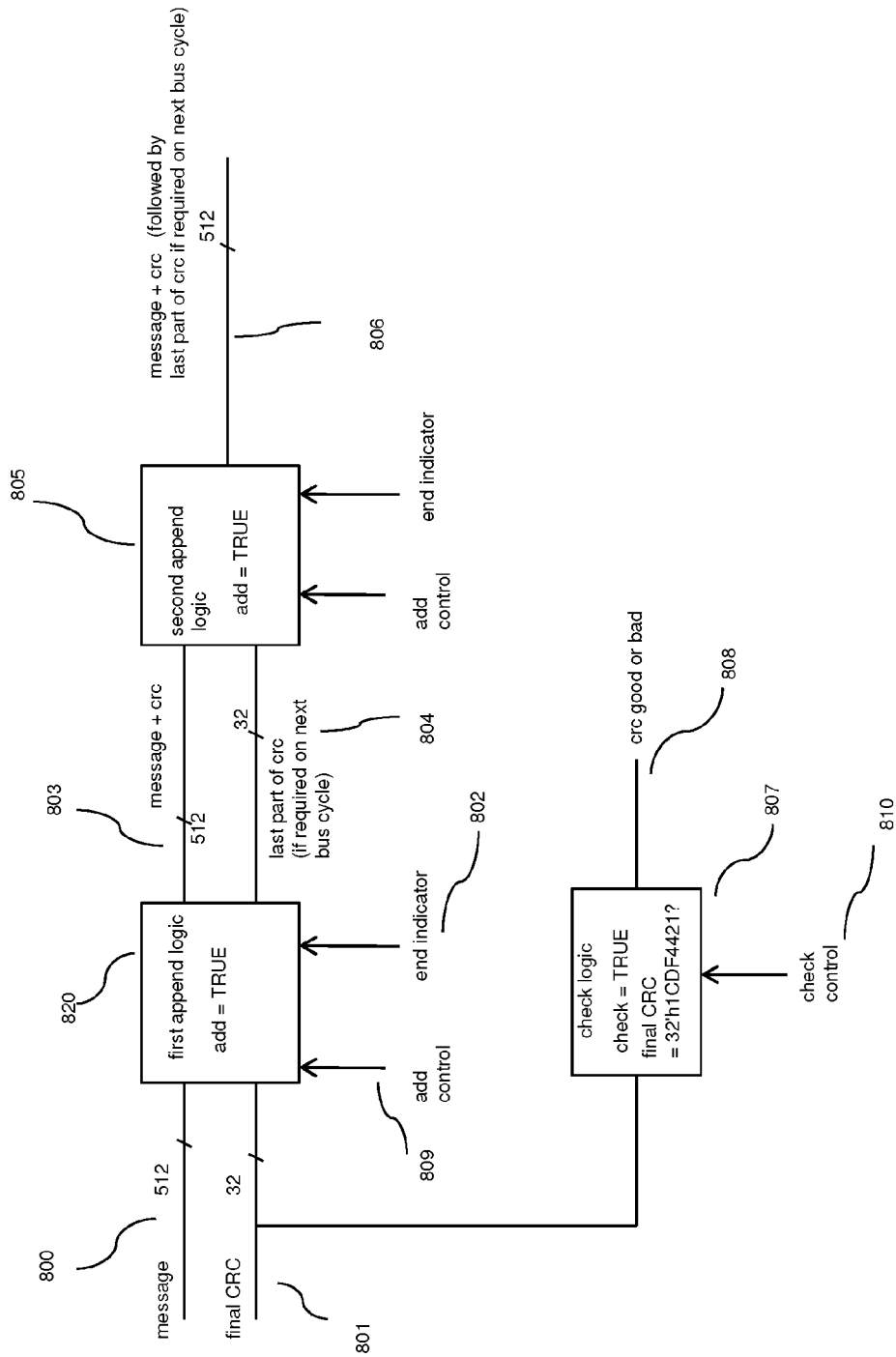
Fig. 8 Adding Logic Circuit to Append CRC to Message and to Check CRC

METHOD AND APPARATUS FOR DETERMINING A CYCLIC REDUNDANCY CHECK (CRC) FOR A DATA MESSAGE

FIELD OF THE INVENTION

This invention relates to data communications systems or computer systems, such as Ethernet, ATM, and Interlaken, where a test needs to be performed to detect errors in data transmission using a Cyclic Redundancy Check (CRC), and more particularly to a method and apparatus for creating a CRC code, and performing a CRC check therewith.

BACKGROUND OF THE INVENTION

A cyclic redundancy check is commonly performed on a stream of data to detect errors. A CRC-enabled device calculates a CRC code for a block of data prior to transmission, and if the CRC code calculated at the receiver does not match the code calculated at the transmitter, an error will have occurred. FIG. 1a shows a typical CRC code, which is known as a CRC-32 IEEE 802.3 polynomial. These features may vary from one standard to another. The specific CRC polynomial is given for illustrative purposes only, and it will be understood that other forms of CRC polynomial may be employed. The CRC-32 IEEE 802.3 polynomial is written as follows:

$$x^{32}+x^{26}+x^{23}+x^{22}+x^{16}+x^{12}+x^{11}+x^{10}+x^8+x^7+x^5+x^4+x^2+x+1$$

Another common representation of the of the CRC writes the corresponding polynomial coefficients as follows:

$$0x04C11DB7$$

The polynomial and the calculation required to arrive at a CRC are clearly defined in the standard, but no means of implementation is specified. The CRC-32 which is part of the standard is defined according to the following equation:

$$CRC = \text{complement remainder of } ((M(x)*x^{32})/G(x))$$

It should be noted that the complement step is specific to this particular standard.

FIG. 1b shows a prior art implementation 110 of an apparatus for calculating a CRC-32 using a Linear Feedback Shift Register (LFSR) circuit, which produces the required result. The message is shifted one bit at a time, and the final CRC is the 32 bits remaining in registers R0 through R31 after completely processing the message. This circuit is not suitable for use with high-speed data due to the limitations of integrated circuit technology. Likewise, a software implementation of the LFSR function cannot keep up with the incoming data at high rates.

Much has been written about the mathematics, which describe the process by which a particular CRC calculation provides reliable error detection properties, and it will not be repeated here. In addition, the mathematical nature of the binary Galois Field GF(2),m, which is used in the calculation process is well known. The relevant information is contained in the following references, the contents of which are herein incorporate by reference:

W. W. Peterson, D. T. Brown; "Cyclic Codes for Error Detection"; ISSN 0096-8390; January 1961

[2] G. Campobello, G. Patane, M. Russo; "Parallel CRC Realization"; ISSN 0018-9340; October 2003

[3] IEEE Std. 802.3™ 2008, Clause 3.2.9

[4] Shieh et. al.; "A Systematic Approach for Parallel CRC Computation"; Journal of Information Science and Engineering 17; 2001

Conceptually, calculating a CRC involves passing the data serially through a Linear Feedback Shift Register (LFSR) one bit at a time where the coefficients of the CRC polynomial correspond to XOR functions on the LFSR. However, modern communication systems require a faster method of calculation, and therefore the parallel method is typically used. This method allows a CRC to be calculated on as many bits in parallel as desired using a tree of exclusive OR (XOR) gates. The arrangement of a particular XOR tree given a specific CRC polynomial and number of inputs bits has been extensively described in the prior art.

SUMMARY OF THE INVENTION

The present invention is based on the realization that there is an advantage to presenting the beginning of a message onto a wide bus even before there is enough data to fill the bus entirely, which may take considerable time. Furthermore, the end of the message may occur at any point on the bus and the remainder of the bus may contain data that is not part of the message of interest. However, the invention implements a means to consider only the message portion of the bus including the partial beginning and end. Consequently, the bus bandwidth is utilized to the fullest extent possible. The message is therefore available for the CRC calculating circuit with minimal delay.

Embodiments of the invention perform a CRC (Cyclic Redundancy Check) calculation with efficient use of time and gates. A source message is arranged on a wide bus (such as 512 bits) in order to process the CRC calculation on many bits in parallel. The result of a single CRC calculation is used as the input seed to the next CRC calculation for the next bus cycle of the message. The initial and final bus cycles may be partially filled with the message. A partial initial bus cycle is padded with zeroes and a compensating input constant used to obtain the correct CRC. The same circuit is advantageously used to calculate the CRC for a number of fully occupied bus cycles resulting in an intermediate CRC at the conclusion of each cycle. A final partial or full bus width cycle is directed to a subcircuit which calculates the final CRC for a number of bytes less than or equal to the full bus width without the use of zero padding, and using the intermediate CRC as an input. The final CRC may be appended to the message for transmission. If the CRC was previously appended, the same circuit determines if the CRC is valid, indicating a message received with no errors. Since the circuit is able to function with messages beginning and ending at various locations on a wide bus, throughput and latency are improved. Gate count is reduced by using a compensating constant instead of providing multiple XOR trees for each possible initial bus occupancy.

Broadly, the invention comprises a method of creating a CRC (Cyclic Redundancy Check) code for a data message, comprising sequentially placing portions of the data message on a bus of width W bits consisting of an integral number N of segments of width S and wherein an initial portion of the message fills n complete segments, where n≦N; processing the initial portion of the message placed on the bus to compute a CRC while compensating for any data on the bus preceding the initial portion; and subsequently processing one or more following portions of the message placed on the bus to update the CRC; and wherein a final portion of the message is processed to update the CRC by separately processing complete segments that do not fill the bus, and any bytes that do not completely fill the last segment.

Thus, according to the present invention there is provided a method of creating a CRC (Cyclic Redundancy Check) code for a data message, comprising placing an initial portion of the data message on a bus of width W bits consisting of an integral number N of segments of width S such that the initial portion of the message fills n complete segments, where $n \leq N$; placing a known bit pattern on any segments preceding a start of the message as determined by a start indicator; computing a first intermediate CRC code for said n segments of the initial portion by applying the W bits of the bus forming an input word to a CRC full processing circuit using a compensating constant to compensate for any known bit pattern preceding the initial portion of the message; placing any subsequent portions of said message width W on said bus during subsequent bus cycles, in each case computing a new first intermediate CRC code on the W bits of the bus as input words using the current first intermediate CRC code as a seed input; and placing a final portion of said message as determined by an end indicator on said bus, wherein said final portion has a width w bits, where $w \leq W$, and wherein said final portion at least completely occupies s segments, where $s<S$; computing a second intermediate CRC code using said s segments as input in a segment processing circuit and using said current first intermediate CRC code as a seed input; and computing a final CRC code using any remaining bytes as input in a byte processing circuit and using said second intermediate CRC as a seed input.

The known bit pattern is preferably all zeros, but it will be understood that it could be all ones, or even some predetermined pattern of ones and zeros. As long as the pattern is known, it is possible to compensate for it in the subsequent CRC computation. The bus is typically the same physical bus, although of course it will be appreciated that different physical buses could be employed at each stage.

Embodiments of the present invention overcome the problem of calculating a CRC when the data extends over many partial or complete cycles, where each cycle transfers a varying number of bits to the inputs to an XOR tree. Several circuits are used in a novel arrangement so as to maximize the throughput of data and at the same time minimize the amount of hardware required.

While some prior art implementations employ a zero substitution at the end of the message and buffer the message to start at a full bus cycle, the present invention employs a novel zero substitution method at the beginning of the message in addition to handling partial end bus cycles without the use of zero substitution. This is an improvement over the prior art in that buffering requirements are reduced. The invention is also able to process all the bits of a bus cycle in parallel regardless of the number of valid bits in a bus cycle, which also improves latency performance compared to the prior art.

In a further aspect the present invention provides an apparatus for creating a CRC (Cyclic Redundancy Check) code for a data message, comprising a bus of width W bits consisting of an integral number N of segments of width S such that the initial portion of the message fills n complete segments, where $n \leq N$; an interface circuit for placing an initial portion of the data message on the bus and placing a known bit pattern on any segments preceding a start of the message as determined by a start indicator; a CRC full processing circuit for computing a first intermediate CRC code for said n segments of the initial portion using the W bits of the bus as an input word and by applying a compensating constant to compensate for any known bit pattern preceding the initial portion of the message; said interface circuit being configured to place any subsequent portions of said message width W on said bus during subsequent bus cycles, said full processing circuit being configured in each case to compute a new first intermediate CRC code on the W bits of the bus as input words using the current first intermediate CRC code as a seed input; said interface circuit being configured to place a final portion of said message as determined by an end indicator on said bus, wherein said final portion has a width w bits, where $w \leq W$, and wherein said final portion at least completely occupies s segments, where $s<S$; a segment processing circuit for computing a second intermediate CRC code using said s segments as input in and using said current first intermediate CRC code as a seed input; and a byte processing circuit for computing a final CRC code using any remaining bytes as input and using said second intermediate CRC as a seed input.

BRIEF DESCRIPTION OF THE DRAWINGS

The invention will now be described in more detail, by way of example only, with reference to the accompanying drawings, in which:

FIG. 1*a* shows a typical CRC definition, known as IEEE 802.3 CRC-32;

FIG. 1*b* shows a typical prior art implementation.

FIG. 2*a* shows how a message may be arranged on a 512-bit wide data bus in one embodiment of the invention.

FIG. 2*b* shows how a message may be arranged on a 512-bit wide data bus after the CRC has been appended in one embodiment of the invention.

FIG. 3 illustrates a preferred embodiment of a circuit and signal arrangement interfacing to a circuit to calculate a CRC, including timing and control signals.

FIG. 4 illustrates a preferred embodiment of the invention showing circuit blocks that calculate the CRC.

FIG. 5 illustrates a detailed circuit block of a preferred embodiment of the invention that calculates a CRC on a full bus width or partial initial bus width.

FIG. 6 illustrates a detailed circuit block of a preferred embodiment of the invention that calculates a CRC on an integral number of bus segments.

FIG. 7 illustrates a detailed circuit block of a preferred embodiment of the invention that calculates a CRC on an integral number of bytes.

FIG. 8 illustrates a detailed circuit block of a preferred embodiment of the invention that appends a CRC to a message and checks a previously appended CRC.

DETAILED DESCRIPTION OF EMBODIMENTS OF THE INVENTION

It will be understood that the term "circuit" as used herein may include functionality that is implemented in software modules.

In general terms, the invention may include a circuit that executes the following steps in the process of calculating a CRC (Cyclic Redundancy Check): A data message is arranged on a W-width (eg 512-bit) bus in segments of S-width (eg 64-bit). Data is arranged such that the initial data completely fills particular S-width segments, beginning with the first available S-width segment. Data is further arranged such that there is a sufficient gap between messages to allow for the addition of a CRC to be appended to the message prior to the start of the next message in order that the same bus clock may be used for the output message. S-width segments, which do not contain data of interest, are set to a value of 0 (zero).

A CRC is calculated on the full W-width bus using a first circuit employing known XOR tree technology, using a pre-calculated constant, which compensates for the number of segments that have been set to 0. A control signal is provided to indicate the location of valid data on the W-width bus. If data continues to exist in additional full W-width bus cycles, the CRC value just calculated is used as the input seed for the next CRC calculation using first circuit. A final bus cycle may not by filled with data of interest, as indicated by a certain number of valid byte positions on a control signal. Data remaining in a final full or partially filled W-width is the input to second CRC calculator circuits which perform the calculation on any number of full S-width segments ranging from 1 to (W/S)-1 (eg 1 to 7) using known XOR tree technology and where the input seed to a calculator stage is the output of the previous stage.

Finally a CRC is calculated using a third circuit on any integral number of bytes ranging from 1 to (S/8) (eg 1 to 8) on the last S-width segment using known XOR tree technology and using the CRC calculated from previous data as an input seed thereby resulting in the final CRC. The final CRC result is appended to the data immediately following the last byte of the input data message.

The final CRC result may be appended within the last W-width bus starting at the first available byte position or if and when the last W-width bus is filled the remaining CRC bytes may be additionally appended at the beginning of the next W-width bus cycle. In principle the XOR trees and feed-forward CRC logic may be implemented using a combinatorial logic array that results in no clocking delays, and the entire calculation performed immediately for each W-width, delayed only by the limitations of the integrated circuit technology of the day. In practice intentional delays may be inserted to account for the limitations of real gate propagation times consistent with the particular integrated circuit technology being used for the implementation. The same or a second instantiation of the circuit based on the present invention may be used to check for correctness of a received message that already includes an appended CRC. The invention may be used to construct circuits with different values of W and S as required as well as various CRC polynomials.

A detailed description of a preferred embodiment of the invention follows. While certain aspects of the description make reference to particular values of bus width W, number of segments S, segment width, number of bytes and CRC polynomial, among other parameters, these are meant only to illustrate and do not limit application of the invention to implementations using other parameter values.

It will be understood that the definition of the particular CRC used for illustration purposes includes certain aspects that are not part of the present invention, such as the complementing of certain bits and the specific bit ordering of the message and its appended CRC. These features vary from one standard to another. Embodiments of the invention are able to accommodate these and many other features specific to a CRC standard message and its appended CRC.

It will also be understood that the expression "circuit" is used in its broadest sense and includes both hardware and software implementations.

In one embodiment of the present invention, a CRC with the definition shown in FIG. 1a is implemented. A message 100 of length n bits is required to have an appended FCS (Frame Check Sequence) 101 that is defined as the CRC calculated using the specified polynomial 103. Accordingly, the length of the CRC is 32 bits.

In a preferred embodiment of the present invention, a message is arranged on an input parallel bus of width W as shown in FIG. 2a and a modified message is arranged on an output parallel bus of width W as shown in FIG. 2b. In the arrangement shown in FIG. 2a the parallel bus width W is equal to 512 bits, which is used for illustration purposes and is not meant to limit the scope of the invention. Data bits on each bus cycle are numbered from 511 to 0 as is conventional. On each bus cycle, data bit 511 may be considered the first bit and data bit 0 considered the last bit. For example, bit 511 is the beginning of a full word and bit 0 is the end of a full word 202. These and other bits are numbered for reference and clarity. The bus is further arranged in an exemplary group of 8 segments S, each with a width of 64 bits. The length of the message can be longer than the width of the bus, and as shown in FIG. 2a, the message spans multiple cycles of the bus. The initial word 200 may be partial, meaning it has been arranged on the bus at the beginning of any S segment. The beginning of the message is indicated by a control signal known as the start indicator 210. The CRC circuit will be responsive to the start indicator during the CRC calculation process.

In one embodiment of the invention, which includes 8 segments, there are 8 possible values of the start indicator 210. In other embodiments of the invention, the number of segments S is at least 1 and the start indicator has at least 1 possible integer value. The message may be arranged advantageously in order to include other data on the bus prior to the start of the message, such as the end of the previous message 201. This maximizes the bandwidth potential of the bus. In order to allow for the appending of the CRC, messages are arranged on the input bus with sufficient spacing 212 at least equal to the length of the CRC. This arrangement advantageously allows the same timing specification on an output bus, also of width W. The initial partial word 200 is typically followed by a full word 202 and additional full words according to the size of the message. Finally, the message ends as indicated by the end indicator 211. The end of the message may result in a partial final word 203. The message may end at any byte position, possibly resulting in a partial final S segment 205. The present invention is able to function with the end indicator 211 pointing to any possible byte position along the bus W. The remainder of the bus following the end indicator 211 may advantageously contain other data, such as the next initial partial word 204, thereby further maximizing the bandwidth potential of the bus.

FIG. 2b illustrates the arrangement of a message on an output parallel bus of width W after a CRC has been appended. The exemplary output message portion of the bus is typically identical to the input message of FIG. 2a. Accordingly, the initial partial word 250 spans a portion of the output bus, followed by full words 251, and ending with a final partial word 252. The final partial word in this case includes an appended CRC 254. Since the CRC 254 has been appended, a new value of the end indicator 256 was calculated, equal to the former end indicator 211 of FIG. 2a plus the number of bits that form the CRC, which is 32 in this example. The output bus may also contain additional data such as the end of the previous message 257 on the first bus cycle and the beginning of the next message 255 on the last bus cycle. In the event that the end indicator is near the end of the bus such that less than the number of bits of the CRC are available in the present bus cycle, the first part of the CRC is appended up to the end of the bus and the remaining bits of the CRC are arranged at the beginning of the next bus cycle.

FIG. 3 illustrates a preferred circuit arrangement that implements the message arrangements of FIG. 2a and FIG. 2b. The message source 300 may be a serial or parallel communication link. An interface circuit 301 has as its input a link that is able to receive from the message source 300 and an output that produces the message arrangement of FIG. 2a. Accordingly, interface circuit 301 consists of buffers and drivers that may be easily implemented by those skilled in the art. It is noted that in the preferred embodiment, only a small amount of buffering is required, where in the example of S=64, the maximum required buffering is 64 bits (plus the number of bits of the appended CRC if spacing is required). Therefore the time delay from the message source 300 to the circuit 304 that calculates the CRC may advantageously be minimized The reason for buffering to align to the start of a segment in this manner will become apparent with a detailed disclosure of CRC calculating circuit 304.

In a preferred embodiment of the invention, the output of interface circuit 301 consists of an integral number of segments 303, each of width 64 bits. In one embodiment of the invention, the number of S segments is equal to 8, equivalent to a bus width W 302 equal to 512 bits. In other embodiments of the invention, the number of S segments is at least equal to 1. The interface circuit 301 functions to place the initial word of a message onto the bus such that the first available S segment is entirely occupied by the first 64 bits of the message. The remainder of the message continues to be arranged on the input message bus 302 during subsequent cycles of the bus, with each bus cycle transferring W bits to the CRC calculating circuit 304. The end of the message may occur prior to the input message bus 302 attaining full occupancy. The means by which CRC calculating circuit 304 is able to function correctly when the message begins or ends as described will be disclosed in the detailed description which follows. Bus interface circuit 301 also functions to generate timing and control signals 307 which may indicate the start of a message, the end of a message, whether to or not to calculate a CRC, and whether to check a CRC, among other indications. Timing and control signals 307 may also include clock and enable signals. The required control signals can be easily generated by those skilled in the art and may take different forms according to the embodiment. CRC calculating circuit 304 is responsive to said control signals to correctly process the message present on its input bus 302. The output of CRC calculating circuit 304 is presented on output bus 306 W containing segments 305 S. The output is arranged according to the illustration of FIG. 2b, namely the original input message together with the CRC appended. Furthermore, circuit 304 functions to generate new timing and control signals 308 as required. For example, when the CRC is appended the end indicator value needs to be modified to account for the new end position. Another possible new control signal is the result of a CRC check, which may take a TRUE or FALSE value.

A preferred embodiment of a circuit to calculate the CRC and to append it to the message is shown at a high level in FIG. 4. With reference to FIG. 4, the CRC circuit will now be described.

Input messages have already been arranged on an input bus 400 as previously described. Further to the bus arrangement, the following parameters are defined with reference to the exemplary embodiment as shown in FIG. 4. The number of segments S that contain valid data at the end of the message minus 1 is designated by j 427. The number of valid message bytes in the last segment S is designated by k 428.

Full processing circuit 410 is responsive to the initial partial word or full word 422 comprising the message by means of start indicator control signal 405. In the event that the initial word comprising the message does not occupy the full 512 bits, as indicated by the start indicator control signal 405, then full processing circuit 410 will respond accordingly as will be shown. Subsequent full words 423 are also processed by full processing circuit 410. Processing of each bus cycle consisting of 512 bits results in a first intermediate CRC 411. In the event that end indicator control signal 406 indicates that additional full words remain, the first intermediate CRC 411 is fed back to circuit 410 for further processing in combination with the next full 512-bit word bus cycle. First intermediate CRC 411 is also available to multiplexer circuit MUX1 415 and segment processing circuit 412.

After all full bus cycles have been processed by full processing circuit 410, there will be a final bus cycle, which may or not be full of data that is part of the message. The final bus cycle 424 is processed by segment processing circuit 412 and byte processing circuit 419. Said circuits are responsive to end indicator 406 to accomplish the final CRC calculation correctly.

Segment processing circuit 412 functions on j segments where j may range from 1 to 7 inclusive. MUX1 functions to correctly pass the result from segment processing circuit 412 in response to the end indicator control signal 406. The result is designated second intermediate CRC 416. For the case where j=0, MUX1 415 passes first intermediate CRC 411 in response to the end indicator control signal 406.

The second intermediate CRC 416 is passed to the byte processing circuit 419 which functions to calculate the final CRC using the bytes remaining in the last segment 425 as well as said second intermediate CRC 416 as inputs. The final segment of the input message, which contains the final bytes is selected by the multiplexer circuit MUX 2 in response to the end indicator control signal 406. The number of bytes in the last segment is designated by k 428 where k may range from 1 to 8 inclusive.

The final CRC 420 resulting from the byte processing circuit 419 is appended to the message by means of the adding logic 421. The resulting message and appended CRC 404 conform to the arrangement illustrated in FIG. 2b 426. The adding logic is responsive to the add control signal 407 and end indicator control signal 406 to add the CRC to the message at the required bit positions on the output bus 404. The adding logic further responds to the check control signal 408 so as to verify the final CRC against a known value in the event that the input message already includes an appended CRC. The result of said verification is the good/bad control signal 409.

The CRC circuit includes a control logic block 402. The purpose of said block is to direct the processing of bus cycles to the correct processing block as well as to maintain proper timing of all signals. Input 401 to and output 403 from the control logic block 402 may take various forms specific to a particular system application including but not limited to a binary code composed of multiple bits corresponding to all possible values of each control signal. Input signals include at least the start indicator 405 and the end indicator 406. In some embodiments, control out 403 functions to indicate modified values of the start indicator 405 and end indicator 406. In some embodiments, control out 403 includes the indication of a pass or fail condition resulting from the calculation of a CRC when the input message includes an appended CRC.

Details of the full processing circuit 410 of FIG. 4 to calculate a CRC on 512-bit input data are illustrated in FIG. 5 and will now be described.

With reference to FIG. 5, message input words 550 of length 512 bits are input to the zeroing logic circuit 554 which functions to fill a value of zero into all the bits which are not part of the message on the first cycle of the input bus. Since the message has been arranged according to the illustration in FIG. 2a, it will be apparent that there are 8 possible ways in which the zeroes are inserted. The zeroing circuit 554 responds to the start indicator control signal 553 as follows. If the start indicator control signal indicates that there is data present in all segments, none of the segments are set to zero. If the start indicator control signal indicates that data is present in the last 7 segments, all 64 bits of the first segment is set to zero. The pattern may continue concluding with all 448 bits of the first 7 segments being set to zero if only the last segment contains valid data. In the event that there is no start indicator, meaning that the input data word 550 is a full word following the initial word, none of the data bits are set to zero. The result of zeroing circuit 554 is input to a data XOR (Exclusive OR) tree 556 designed for a 512-bit word in order to calculate the required CRC. The specific configuration of this XOR tree as well as others in the present invention can be easily determined by those skilled in the art as detailed in the above. Each XOR tree configuration is further determined by the coefficients of the required CRC polynomial as described in the references.

In order to complete a CRC calculation cycle on 512 bits, a bitwise XOR 558 is performed using as inputs the data XOR tree output 557 and a particular 32-bit value 559, which depends on a number of factors. For the initial bus cycle of the message, the input constant is one of 8 values which function to compensate for the number of segments which have been set to zero. One of 8 initial constants 568 is selected by means of MUX4 567 according to the value of the start indicator control signal 553 resulting in the selection of an initial seed 565. The hexadecimal representations of the initial constants 568 and their corresponding zero fill values are as follows.

32'h6904BB59 used when the first 448 bits of the message having been set to zero and the remaining 64 bits form the start of the message 32'h552d22C8 used when the first 384 bits of the message having been set to zero and the remaining 128 bits form the start of the message 32'hFBAC7C3A used when the first 320 bits of the message having been set to zero and the remaining 192 bits form the start of the message 32'h4A55AF67 used when the first 256 bits of the message having been set to zero and the remaining 256 bits form the start of the message 32'h7243C868 used when the first 192 bits of the message having been set to zero and the remaining 320 bits form the start of the message 32'h5632EEB0 used when the first 128 bits of the message having been set to zero and the remaining 384 bits form the start of the message 32'h6d5AEC34 used when the first 64 bits of the message having been set to zero and the remaining 448 bits form the start of the message 32'h93394E51 used when no bits have been set to zero and all 512 bits form the start of the message The value of each constant may be pre-computed according to the following process. For each case where a certain number of bits have been set to zero, a value of 32 ones is used as an initial value and shifted by the number of zeroed bits and the CRC computed. The resulting CRC is the corresponding input constant. It is noted that the value of each constant depends on the particular polynomial required for the specific CRC. The constants presented herein have been calculated according to the CRC-32 specified in IEEE 802.3 Clause 3.2.9. A preset of 32 ones is equivalent to complementing the first 32 bits of the message, which is another requirement of the IEEE 802.3 CRC-32.

Advantageously, only eight constant values are required for a 512-bit wide bus because the input data message has been arranged according to FIG. 2a where complete S segments are filled. Furthermore, only one data XOR tree is required regardless of the number of message bits in the initial bus cycle. Therefore there is a saving of hardware gates since the XOR trees required would be quite large for each possible number of filled segments.

There may follow subsequent bus cycles after the initial bus cycle containing message data on all 512 bits. The same circuit of FIG. 5 is advantageously used to process an unlimited number of complete bus cycles, which form part of the same message. This is accomplished by storing the present XOR result 560 in a temporary storage location 561 and using the stored value in feedback through the polynomial XOR tree for 512 bit data 563; selecting the result 564 of the polynomial XOR tree 563 by means of MUX5 570 and the start indicator control signal 553; forwarding the result 559 to bitwise XOR 558 together with the data XOR tree result of the next bus cycle 557; and finally to arrive at a revised CRC 560. When all bus cycles except the last have been processed for the CRC, the result becomes the first intermediate CRC 562 which is then available for calculating the final CRC on the last bus cycle of the message, which may contain valid data in at most 512 bits. The next step is performed by the segment processing circuit 412 of FIG. 4 which is illustrated in detail in FIG. 6.

With reference to FIG. 6, the segment processing circuit to calculate the CRC on all but the last segment will now be described in detail.

There are from 1 to 7 possible complete segments, which comprise all but the last segment of the final bus cycle of the message. Accordingly, the segment processing circuit of FIG. 6 contains 7 identical sets of XOR trees, which function in parallel to produce 7 possible CRC results. Each set of XOR trees receives as input a group of 64 bits from the final bus cycle and a CRC input from a previous CRC calculation. For example, the first set of XOR trees 608, 609 receives as input 600 bits 511 to 448 and the first intermediate CRC 601 obtained after all the full bus cycles have been processed. Next a bitwise XOR is performed 610 resulting in a CRC value poly1 604 corresponding to the previously defined integer variable j=1. The CRC value poly1 604 is directed to the input of a second set of XOR trees 611, 612 together with the next group 602 of 64 bits 447 to 384, and after bitwise XOR 613 result in a CRC value poly2 605 corresponding to j=2. CRC value poly 2 is directed to a third set of XOR trees, and so on, ending with a seventh set of XOR trees responsive to an input 603 of bits 127 to 64 and poly6 and producing a result poly7 606 corresponding to j=7. The resulting 7 CRC values are directed to MUX1 415 shown in the CRC circuit of FIG. 4 as previously described. The output of said MUX1 is referred to as the second intermediate CRC, which is available to the byte processing circuit shown in detail in FIG. 7.

With reference to FIG. 7, the byte processing circuit to calculate CRC on the final bytes of the last segment will now be described in detail. The last segment will be comprised of k bytes where k is an integer value and may range from 1 to 8 inclusive. The 64 bits comprising the final segment 700 are directed to a data XOR tree 710 designed for 64-bit input. The second intermediate CRC 701 is provided in parallel to 8 polynomial XOR trees 711, 712, 713, 714, 715, 716, 717, 718 corresponding to all possible values of k. The data XOR tree 710 output 702 is bitwise XORed with the output of each polynomial XOR tree to produce 8 possible final CRC values 731, 732, 733, 734, 735, 736, 737, 738 corresponding to all possible values of k. The actual final CRC is selected by MUX6 707 in response to the value of k encoded by end indicator control signal 708 to produce the final CRC 709.

FIG. 8 illustrates a circuit that appends the final CRC 801 to the corresponding input message 800. The circuit of FIG. 8 passes the entirety of the original message unaltered to the output bus 806 except that the final CRC is appended immediately following the end of the message when directed to do so by the add control signal 809. The first append logic circuit 820 functions to place final CRC 801 bits on the message+crc bus 803 beginning with the first bit after the last bit of the message in response to the location encoded by the end indicator control signal 802 and if the add control signal 809 is in a TRUE state. The remaining bits of the final CRC 801 are placed on the message+crc bus 803 in order until all 32 bits have been placed or until bit 0 of the message+crc bus 803 is reached. If additional bits remain in the final CRC 801, then these bits are directed to the second append logic circuit 805 which functions to place the remaining bits onto message+crc bus 806 on the next bus cycle beginning with bit 511 and continuing until all remaining bits of the final CRC have been placed.

Having computed a final CRC, it is advantageous to use this result to check if the CRC is correct in the event that a CRC has already been appended to the message. The CRC when computed on a message that already contains an appended CRC will result in a known constant value. In the case of the CRC-32 specified in IEEE 802.3, this constant is known to be the hexadecimal value 32'h1CDF4421. Therefore check logic 807 is provided which compares the final CRC 801 to said known constant value. The check logic 807 produces a TRUE or FALSE result depending on the result of said comparison in response to the check control signal 810.

An embodiment of the present invention uses a novel circuit arrangement to calculate a CRC and append it to a message. In this embodiment, savings are demonstrated in the number of gates used and a time advantage is demonstrated for completion of CRC calculation process. These advantages come about in part due to a parallel circuit structure whereby a number of CRC values are calculated in parallel and the correct one selected according to the value of a control signal. In addition, a large XOR tree structure is used advantageously to process input data with a variable number of possible valid bits. Additional advantages are due to the prior arrangement of the input message onto a particular bus structure composed of segments.

The present invention may be implemented in a variety of hardware technologies such as FPGA (Field Programmable Gate Array) or ASIC (Application Specific Integrated Circuit).

Other embodiments of the present invention may employ different values of W, S, and CRC polynomial without differing substantially from the exemplary circuit. Some embodiments may transmit the final CRC on a separate channel instead of appending the CRC to the message.

In another embodiment of the invention, means are provided to process the CRC correctly in the event that bus cycles occurring between the initial word and final word do not contain data that is part of the message. This is accomplished by means of an enable signal that functions to suspend all CRC processing circuits during said bus cycles. Processing resumes normally when full bus cycles are present.

In yet another embodiment of the invention, means are provided to process the CRC correctly in the event that bus cycles occurring between the initial word and final word are only partially occupied with data that is part of the message. In this event, adding logic 421 of FIG. 4 does not append the final CRC 420 to the message when it is known that end indicator 406 corresponds to the end of only a part of the message. Rather, final CRC 420 is returned to full processing circuit 410 as an input constant and the remainder of the message is processed normally as already disclosed. This procedure may be followed as many times as required for bus cycles which include gaps in the present message.

It is noted that some CRC definitions include inverting certain bits or they may define a certain bit ordering. For example, the CRC-32 defined in IEEE 802.3 requires the complementing of the first 32 bits. These additional bit manipulations may be easily implemented by those skilled in the art without substantial departure from the present invention.

It should be appreciated by those skilled in the art that any block diagrams herein represent conceptual views of illustrative circuitry embodying the principles of the invention. For example, a processor may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included.

We claim:

1. A method of creating a CRC (Cyclic Redundancy Check) code for a data message, comprising:
   placing an initial portion of the data message on a bus of width W bits consisting of an integral number N of segments of width S such that the initial portion of the message fills n complete segments, where $n \leq N$;
   placing a known bit pattern on any segments preceding a start of the message as determined by a start indicator;
   computing a first intermediate CRC code for said n segments of the initial portion by applying the W bits of the bus forming an input word to a CRC full processing circuit using a compensating constant to compensate for any known bit pattern preceding the initial portion of the message;
   placing any subsequent portions of said message width W on said bus during subsequent bus cycles, in each case computing a new first intermediate CRC code on the W bits of the bus as input words using the current first intermediate CRC code as a seed input;
   placing a final portion of said message as determined by an end indicator on said bus, wherein said final portion has a width w bits, where $w \leq W$, and wherein said final portion at least completely occupies s segments, where $s < S$;
   computing a second intermediate CRC code using said s segments as input in a segment processing circuit and using said current first intermediate CRC code as a seed input; and
   computing a final CRC code using any remaining bytes as input in a byte processing circuit and using said second intermediate CRC as a seed input.

2. The method of claim 1, wherein said known bit pattern comprises a string of zeros.

3. The method of claim 2, wherein said processing circuits comprise respective first, second and third exclusive OR trees.

4. The method of claim 3, wherein each of the first, second, and third exclusive OR trees performs the function of a polynomial division on an input data word and input polynomial, the resultant remainder being equal to the CRC of the input data word.

5. The method of claim 1, wherein sequential data messages are further arranged on the bus of width W with an unoccupied interval at least equal to the number of bits determined by the required CRC code.

6. The method of claim 1, wherein the final CRC code is appended to the message upon completion of its calculation and both are presented to an output bus of width W wherein the clock speed of the output bus is the same as the input bus, and wherein the remaining bits of the CRC code which are unable to fit onto the current bus cycle are held until the next bus cycle.

7. The method of claim 1, wherein each segment consists of an integral number of bytes and the number of segments is at least 1.

8. The method of claim 1, wherein the final CRC code is appended to the message upon and presented to an output bus of width at least 1 bit where the speed of the bus clock is different from that of the input bus.

9. The method of claim 2, wherein the second exclusive OR tree is constructed as a group of (W/S)-1 series-coupled exclusive OR trees each functioning to calculate a CRC on S bits.

10. The method of claim 2, wherein the third exclusive OR tree is constructed as a parallel set of exclusive OR trees each functioning to calculate a CRC on an integer number of bytes ranging from 1 to S/8 inclusive.

11. The method of claim 1, wherein the CRC is calculated using a 32-bit CRC polynomial defined as follows:

$$x^{32}+x^{26}+x^{23}+x^{22}+x^{16}+x^{12}+x^{11}+x^{10}+x^8+x^7+x^5+x^4+x^2+x+1.$$

12. The method of claim 2, wherein W=512, S=64, and the compensating constants have the following hexadecimal values as a function of the number of segments which have been set to zero:

32'h6904BB59 used when the first 448 bits of the message having been set to zero and the remaining 64 bits form the start of the message, 32'h552d22C8 used when the first 384 bits of the message having been set to zero and the remaining 128 bits form the start of the message, 32'hFBAC7C3A used when the first 320 bits of the message having been set to zero and the remaining 192 bits form the start of the message, 32'h4A55AF67 used when the first 256 bits of the message having been set to zero and the remaining 256 bits form the start of the message, 32'h7243C868 used when the first 192 bits of the message having been set to zero and the remaining 320 bits form the start of the message, 32'h5632EEB0 used when the first 128 bits of the message having been set to zero and the remaining 384 bits form the start of the message, 32'h6d5AEC34 used when the first 64 bits of the message having been set to zero and the remaining 448 bits form the start of the message and 32'h93394E51 used when no bits have been set to zero and all 512 bits form the start of the message.

13. The method of claim 1, wherein S contains 64 bits and W is equal to S times one of 1, 2, 3, 4, 5, 6, 7, or 8.

14. The method of claim 1, wherein the final CRC code is presented on a dedicated bus of width at least 1.

15. The method of claim 1, wherein the final CRC is compared to a known constant to determine if the CRC indicates transmission errors in the event that the input message includes an appended CRC.

16. The method of claim 1, wherein the processing of the CRC code is temporarily suspended during bus cycles which do not contain data forming part of the message by means of an enable control signal.

17. The method of claim 3, wherein the wherein the final CRC code is fed back to the first XOR tree as a seed input in order to calculate a CRC correctly when the input message contains at least two initial partial words and at least two final partial words.

18. The method of claim 1, wherein the processing is carried out on an integrated circuit.

19. An apparatus for creating a CRC (Cyclic Redundancy Check) code for a data message, comprising:
a bus of width W bits consisting of an integral number N of segments of width S such that the initial portion of the message fills n complete segments, where $n \leq N$;
an interface circuit for placing an initial portion of the data message on the bus and placing a known bit pattern on any segments preceding a start of the message as determined by a start indicator;
a CRC full processing circuit for computing a first intermediate CRC code for said n segments of the initial portion using the W bits of the bus as an input word and by applying a compensating constant to compensate for any known bit pattern preceding the initial portion of the message;
said interface circuit being configured to place any subsequent portions of said message width W on said bus during subsequent bus cycles, said full processing circuit being configured in each case to compute a new first intermediate CRC code on the W bits of the bus as input words using the current first intermediate CRC code as a seed input;
said interface circuit being configured to place a final portion of said message as determined by an end indicator on said bus, wherein said final portion has a width w bits, where $w \leq W$, and wherein said final portion at least completely occupies s segments, where $s < S$;
a segment processing circuit for computing a second intermediate CRC code using said s segments as input in and using said current first intermediate CRC code as a seed input; and
a byte processing circuit for computing a final CRC code using any remaining bytes as input and using said second intermediate CRC as a seed input.

20. The apparatus of claim 19, wherein said known bit pattern comprises a string of zeros.

21. The apparatus of claim 20, wherein said processing circuits comprise respective first, second and third exclusive OR trees.

22. The apparatus of claim 21, wherein each of the first, second, and third exclusive OR trees performs the function of a polynomial division on an input data word and input polynomial, the resultant remainder being equal to the CRC of the input data word.

23. The apparatus of claim 19, wherein said interface circuit is configured to arrange sequential data messages arranged on the bus of width W with an unoccupied interval at least equal to the number of bits determined by the required CRC code.

24. The apparatus of claim 19, further comprising an output circuit for appending the final CRC code to the message upon completion of its calculation and presenting both to an output bus of width W wherein the clock speed of the output bus is the same as the input bus, and wherein the remaining bits of the CRC code which are unable to fit onto the current bus cycle are held until the next bus cycle.

25. The apparatus of claim 19, wherein each segment consists of an integral number of bytes and the number of segments is at least 1.

26. The apparatus of claim 19, wherein the final CRC code is appended to the message upon and presented to an output bus of width at least 1 bit where the speed of the bus clock is different from that of the input bus.

27. The apparatus of claim 20, wherein the second exclusive OR tree is constructed as a group of (W/S)-1 series-coupled exclusive OR trees each functioning to calculate a CRC on S bits.

28. The apparatus of claim 20, wherein the third exclusive OR tree is constructed as a parallel set of exclusive OR trees each functioning to calculate a CRC on an integer number of bytes ranging from 1 to S/8 inclusive.

29. The apparatus of claim 19, wherein the CRC is calculated using a 32-bit CRC polynomial defined as follows:

$$x^{32}+x^{26}+x^{23}+x^{22}+x^{16}+x^{12}+x^{11}+x^{10}+x^8+x^7+x^5+x^4+x^2+x+1.$$

30. The apparatus of claim 20, wherein W=512, S=64, and the compensating constants have the following hexadecimal values as a function of the number of segments which have been set to zero:
- 32'h6904BB59 used when the first 448 bits of the message having been set to zero and the remaining 64 bits form the start of the message,
- 32'h552d22C8 used when the first 384 bits of the message having been set to zero and the remaining 128 bits form the start of the message,
- 32'hFBAC7C3A used when the first 320 bits of the message having been set to zero and the remaining 192 bits form the start of the message,
- 32'h4A55AF67 used when the first 256 bits of the message having been set to zero and the remaining 256 bits form the start of the message,
- 32'h7243C868 used when the first 192 bits of the message having been set to zero and the remaining 320 bits form the start of the message,
- 32'h5632EEB0 used when the first 128 bits of the message having been set to zero and the remaining 384 bits form the start of the message,
- 32'h6d5AEC34 used when the first 64 bits of the message having been set to zero and the remaining 448 bits form the start of the message and
- 32'h93394E51 used when no bits have been set to zero and all 512 bits form the start of the message.

31. The apparatus of claim 19, wherein S contains 64 bits and W is equal to S times one of 1, 2, 3, 4, 5, 6, 7, or 8.

32. The apparatus of claim 19, further comprising a dedicated bus of width at least 1 for presenting the final CRC code.

33. The apparatus of claim 19, further comprising a circuit for comparing the final CRC to a known constant to determine if the CRC indicates transmission errors in the event that the input message includes an appended CRC.

34. The apparatus of claim 19, a control circuit generating a control signal for temporarily suspending the processing of the CRC code during bus cycles which do not contain data forming part of the message.

35. The apparatus of claim 21, wherein the output of the byte processing circuit is coupled back in a feedback loop to the first XOR tree as a seed input in order to compute a CRC correctly when the input message contains at least two initial partial words and at least two final partial words.

36. The apparatus of claim 19, which is implemented on an integrated circuit.

37. A method of creating a CRC (Cyclic Redundancy Check) code for a data message in a data communications system, comprising:
- sequentially placing portions of the data message on a bus of width W bits consisting of an integral number N of segments of width S and wherein an initial portion of the message fills n complete segments, where n≦N;
- processing the initial portion of the message placed on the bus to compute a CRC while compensating for any data on the bus preceding the initial portion;
- subsequently processing one or more following portions of the message placed on the bus to update the CRC;
- wherein a final portion of the message is processed to update the CRC by separately processing complete segments that do not fill the bus and any bytes that do not completely fill the last segment; and
- wherein the sequentially placing, processing, and subsequently processing are performed by the data communications system.

* * * * *